United States Patent [19]

Swart

[11] Patent Number: 5,450,017
[45] Date of Patent: Sep. 12, 1995

[54] TEST FIXTURE HAVING TRANSLATOR FOR GRID INTERFACE

[75] Inventor: Mark A. Swart, Upland, Calif.

[73] Assignee: Everett Charles Technologies, Inc., Pomona, Calif.

[21] Appl. No.: 161,250

[22] Filed: Dec. 3, 1993

[51] Int. Cl.⁶ .............................................. G01R 31/02
[52] U.S. Cl. .................................... 324/754; 324/757; 324/758
[58] Field of Search ............ 324/158 R, 158 F, 158 P, 324/754, 758, 757

[56] References Cited

U.S. PATENT DOCUMENTS

| | | | |
|---|---|---|---|
| 4,352,061 | 9/1982 | Matrone | 324/158 F |
| 4,833,402 | 5/1989 | Peterson | 324/754 |
| 5,270,641 | 12/1993 | Van Loan et al. | 324/158 |

Primary Examiner—Kenneth A. Wieder
Assistant Examiner—Mark Wardas
Attorney, Agent, or Firm—Christie, Parker & Hale

[57] ABSTRACT

A circuit board tester for converting a bare board circuit tester from a wired to a grid type tester comprises an upper probe plate having a plurality of upper test probes arranged to connect with a front side of a PCB and a grid module having a lower probe plate containing a recessed portion for accommodating a plurality of lower test probes mounted on a translator fixture. The lower test probes connect at one end with a plurality of grid pins arranged in a standard grid pattern in the recessed portion of the lower probe plate. The lower test probes connect at the other end with a back side of the circuit board under test. A stripper plate is disposed on the lower pin grid, and the translator fixture is mounted on the stripper plate for translating the lower test probes from the standard grid pattern to a random off-grid pattern corresponding with test points in circuits on the back side of the board. The upper and lower test probes are electrically connected to upper and lower probe plate interface pins which facilitate electrical connection with the circuit tester electronics. A circuit board is tested by connecting the grid fixture to receiver interface pins on an external electronic test analyzer, placing the board on the translator fixture, lowering the upper probe plate toward the lower probe plate, and applying pressure between the plates. The grid module can be interchanged with a wired test fixture for selectively testing boards either in a wired test configuration or a grid type configuration.

17 Claims, 9 Drawing Sheets

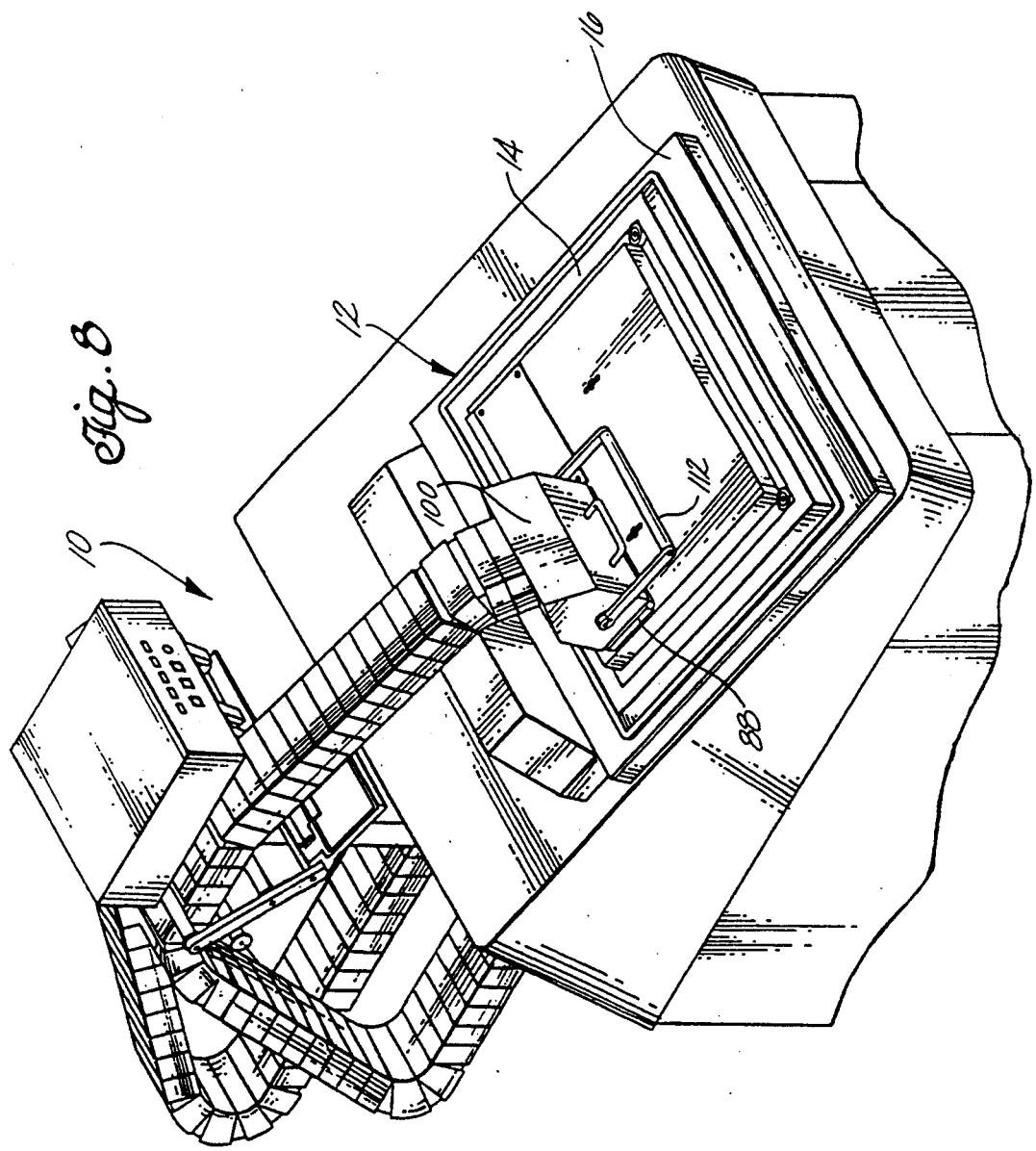

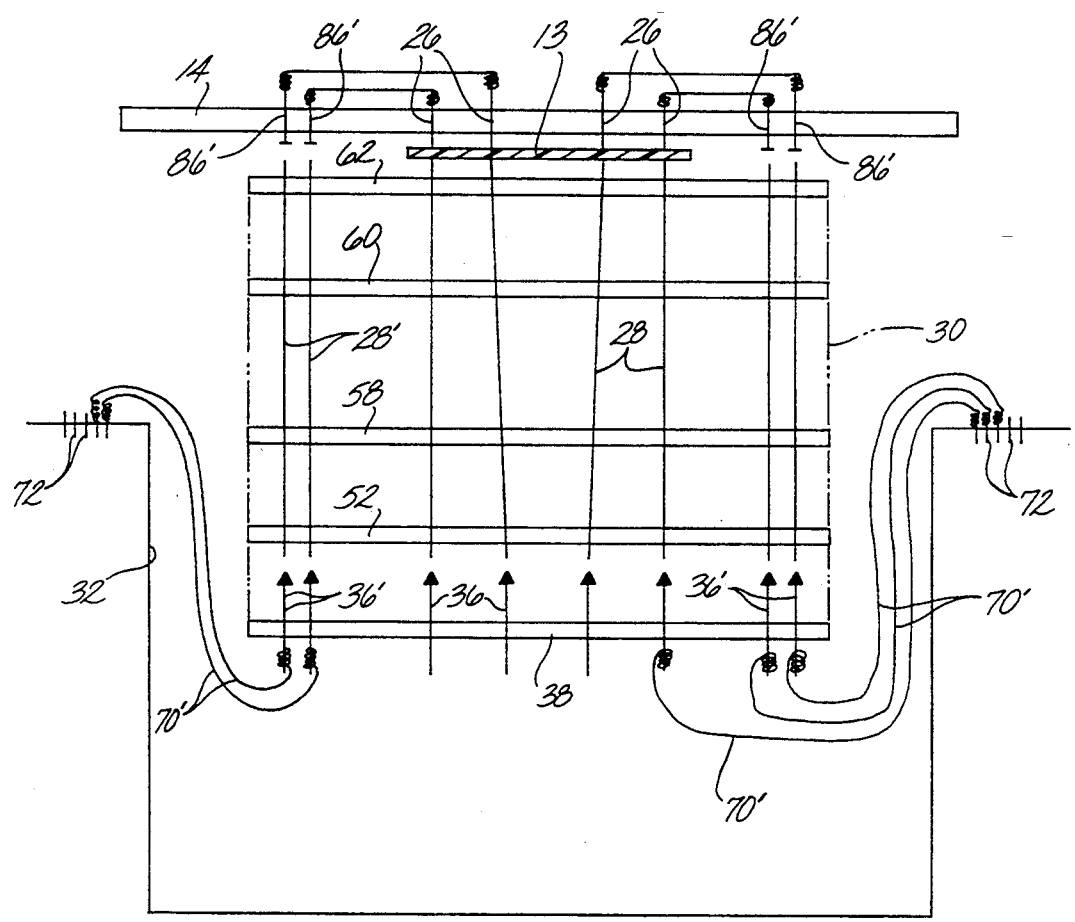

TEST FIXTURE HAVING TRANSLATOR FOR GRID INTERFACE

FIELD OF THE INVENTION

This invention relates to test fixtures for the automatic testing of printed circuit boards, and more particularly, to a test fixture that is configured to selectively convert a dedicated bare board tester from a wired type tester to a grid type tester.

BACKGROUND OF THE INVENTION

Automatic test equipment for checking printed circuit boards has long involved use of a "bed-of-nails" test fixture to which the circuit board is mounted during testing. This test fixture includes a large number of nail like, spring loaded test probes arranged to make electrical contact under spring pressure with designated test points on the circuit board under test. Any particular circuit laid out on a printed circuit board is likely to be different from other circuits, and consequently, the bed-of-nails arrangement for contacting test points in a particular circuit board must be customized for that circuit board. When the circuit to be tested is designed, a pattern of test points to be used in checking it is selected, and a corresponding array of test probes is configured in the test fixture. This method typically involves drilling a pattern of holes in a probe plate to match the customized array of test probes and then mounting the test probes in the drilled holes on the probe plate. The circuit board is then mounted in the fixture, superimposed on the array of test probes. During testing, the spring loaded test probes are brought into spring pressure contact with the test points on the circuit board under test. Electrical test signals are then transferred from the board to the test probes and then to the exterior of the fixture for communication with a high speed electronic test analyzer which detects continuity or lack of continuity between various test points in the circuits on the board.

Various approaches have been used in the past for bringing the test probes and the circuit board under test into pressure contact for testing. One class of these fixtures is a wired test fixture in which the test probes are individually wired to separate interface contacts for use in transmitting test signals from the probes to the external electronically controlled test analyzer. These wired test fixtures are often referred to as "vacuum test fixtures" since a vacuum may be applied to the interior of the test fixture housing during testing to compress the circuit board into contact with the test probes. A lid on the housing is closed over the test fixture to form a vacuum seal between the lid and the probe plate. A vacuum applied to the region between the lid and the probe plate then moves the lid toward the probe plate which compresses the circuit board between the lid and the probe plate. This applies spring pressure from the probes to the board. Customized wire test fixtures of similar construction also can be made by using mechanical means, other than vacuum, to apply the spring force necessary for compressing the board into contact with the probes during testing.

One type of bare board circuit tester incorporating a wired test fixture is disclosed in U.S. patent application Ser. No. 07/824,854, filed Jan. 22, 1992, now U.S. Pat. No. 5,270,641 which is assigned to the assignee of this application. The circuit tester disclosed in the '854 application comprises a dual side access wired test fixture that permits the automatic testing of circuits on both sides of a printed circuit board simultaneously. The wired test fixture comprises upper and lower probe plates each having an array of test probes configured in a pattern corresponding to the patterns of test points in circuits on the top surface and bottom surface of the circuit board, respectively. The dual side access test fixture permits testing of circuits on the bottom side of the board by standard wired fixturing while testing of circuits on the top side of the board is provided by an external upper interface connector mounted over the upper probe plate. The upper interface connector allows the upper test probes to be electrically connected to the test electronics without having to route interface connections from the upper probe plate to the lower probe plate. Eliminating the need to transfer test signals from the upper probe plate to the lower probe plate provides for a larger test surface area on both the upper and lower probe plates since there is no need to occupy the probe plates with transfer pins. Another advantage is that test signals from the upper probe plate, being communicated directly from the upper interface connector to the external electric test analyzer, avoids use of additional wired interface pins.

As mentioned previously, the customized wired test fixtures are but one class of fixtures that may be used in a bare board circuit tester for transmitting test signals between the external electronic test analyzer and the printed circuit board; and more particularly, vacuum fixtures are but one category of wired test fixtures. A further class of test fixtures that may be used for bare board circuit testing is the so-called grid type fixture in which the test points on both sides of a board are contacted by flexible pins or tilt pins which can move or otherwise be positioned to contact the random pattern of test points on the board and transfer test signals from the board to sets of interface pins arranged in a grid pattern on the receiver. In these grid type testers, fixturing is generally less complex and simpler than in the customized wired test fixtures because there is no need to individually hard wire the test probes to separate interface contacts for each differently configured circuit to be tested; but with a grid system, the grid interfaces and test electronics are substantially more complex and costly.

In a grid type fixture, the wiring for the grid array remains constant, independent of the configuration of the particular circuit board. What does change, however, is what is referred to as the translator fixture. The translator fixture includes a bottom plate having a hole pattern corresponding to the grid pattern of openings in a standard pin grid array, and a top plate having a hole pattern corresponding to the random off-grid pattern of contact points to be tested on a printed circuit board. A number of electrically conductive translator pins (these can be flexible pins or tilt pins) are mounted in the holes of the top and bottom plates. As the translator pins travel through the translator fixture they are redirected by the hole patterns of the plates to provide individual conductive paths between the standard grid pattern and the off-grid pattern corresponding to the test points on the circuit board under test.

The construction of the grid type translator fixture is typically less labor intensive than the rewiring of test probes in a wired type test fixture. Therefore, it is often desirable to use a grid type test fixture when testing printed circuit boards having various different shapes and/or configurations. However, the downside of using a grid type test fixture to test circuit boards is that it requires an interface with a substantially more complex and costly external electronic test analyzer than that used with wired testing. Accordingly, the decision of whether or not to purchase a grid type circuit tester must take into account the competing factors of low labor costs for fixturing and the costly electronic test analyzer.

The present invention overcomes this dilemma by providing a bare board circuit tester that is capable of conducting either wired type testing or grid type testing for those occasions where one approach is more beneficial than the other. The tester of this invention is configured so that a grid type test fixture can be used interchangeably on the same test unit with a wired type test fixture. As a result the user may convert selectively from wired type circuit testing to grid type circuit testing when circuit boards having a variety of shapes and/or configurations are to be tested. The ability to switch from a wired fixture in such a situation allows the user to realize a substantial savings of time and labor associated with not having to individually hard wire the test probes for each different printed circuit board configuration.

The invention also permits the interchangeability of existing wired type test fixtures to grid type test fixtures without substantial modification, allowing the user to upgrade and increase the flexibility of existing wired circuit testers without having to incur the costs associated with having to purchase a dedicated grid type circuit tester. The invention also can be manufactured so that it permits grid type testing on both sides of a printed circuit board while avoiding the cost of using thousands of additional probes and switch points required in conventional grid testers.

SUMMARY OF THE INVENTION

Briefly, one embodiment of the invention comprises a grid interface test fixture for selectively converting a bare board wired type circuit tester to a grid type tester. The grid interface test fixture includes an upper probe plate supporting a plurality of upper test probes arranged in a random pattern aligned with circuits on a front side of a printed circuit board. A lower probe plate disposed below the upper probe plate has a recessed translator opening sized and configured to accommodate a translator fixture. A lower pin grid at the base of the translator opening comprises a plurality of grid pins arranged in a grid pattern supported and aligned by a baseplate. A translator fixture is removably positioned over the baseplate and the grid pins within the translator opening. The translator fixture comprises a plurality of translator pins aligned by support plates that retain the translator pins which translate test signals from the grid pattern at one end of the translator fixture, communicating with the grid pins, to a random off-grid arrangement of contact points at the other end of the translator module, communicating with circuits a back side of the printed circuit board.

In one embodiment, the grid interface tester is arranged on a module that is selectively used as an alternative means of testing with a wired test fixture base removably mounted to the same test unit. The wired fixture can include a plurality of upper probe plate interface wires connected to a plurality of upper test probes on the upper probe plate. The interface wires extend from the upper test probes to a plurality of upper probe plate interface pins carried on the upper probe plate to accommodate interconnection with test electronics in an external bare board circuit tester.

The wired test fixture also includes a plurality of lower probe plate interface wires connected to lower test probes on the lower probe plate. These interface wires extend from the lower test probes to a plurality of lower probe plate interface pins arranged on the lower probe plate to accommodate interconnection with the test electronics of the bare board circuit tester. The lower test probes are electrically connected to the bare board circuit tester by releasably mounting the lower probe plate to the tester so that the lower probe plate interface pins releasably connect to receiver interface pins on the tester. The receiver interface pins are connected to the test electronics.

The grid interface test fixture can be used conjunction with the wired bare board circuit tester, to test the electrical continuity of both sides of a printed circuit board. The wired test fixture can be disconnected from the receiver interface pins and the grid fixture of this invention can be connected to the same receiver interface pins of the tester. The translator fixture is then positioned in the recessed opening of the lower probe plate, a board is positioned on the translator fixture, and the board is tested by grid fixturing and testing techniques as an alternative to wired test fixturing techniques.

Fixturing therefore can be carried out selectively, by using either a wired type fixturing arrangement or a grid fixture, depending upon the characteristics of the particular board under test. The test electronics remain the same in either instance, which can greatly enhance versatility of testing, including saving time and the expense of both types of dedicated fixtures.

These and other features and advantages of the present invention will be better understood with reference to the following detailed description and the accompanying drawings.

BRIEF DESCRIPTION OF THE DRAWINGS

FIG. 8 is a fragmentary perspective view of the bare board circuit tester of FIG. 7 in a closed position; and FIG. 9 is a schematic side elevational view illustrating an alternative means of transmitting test signals from test probes on an upper probe plate to test electronics in the tester.

DETAILED DESCRIPTION

Figure 1:
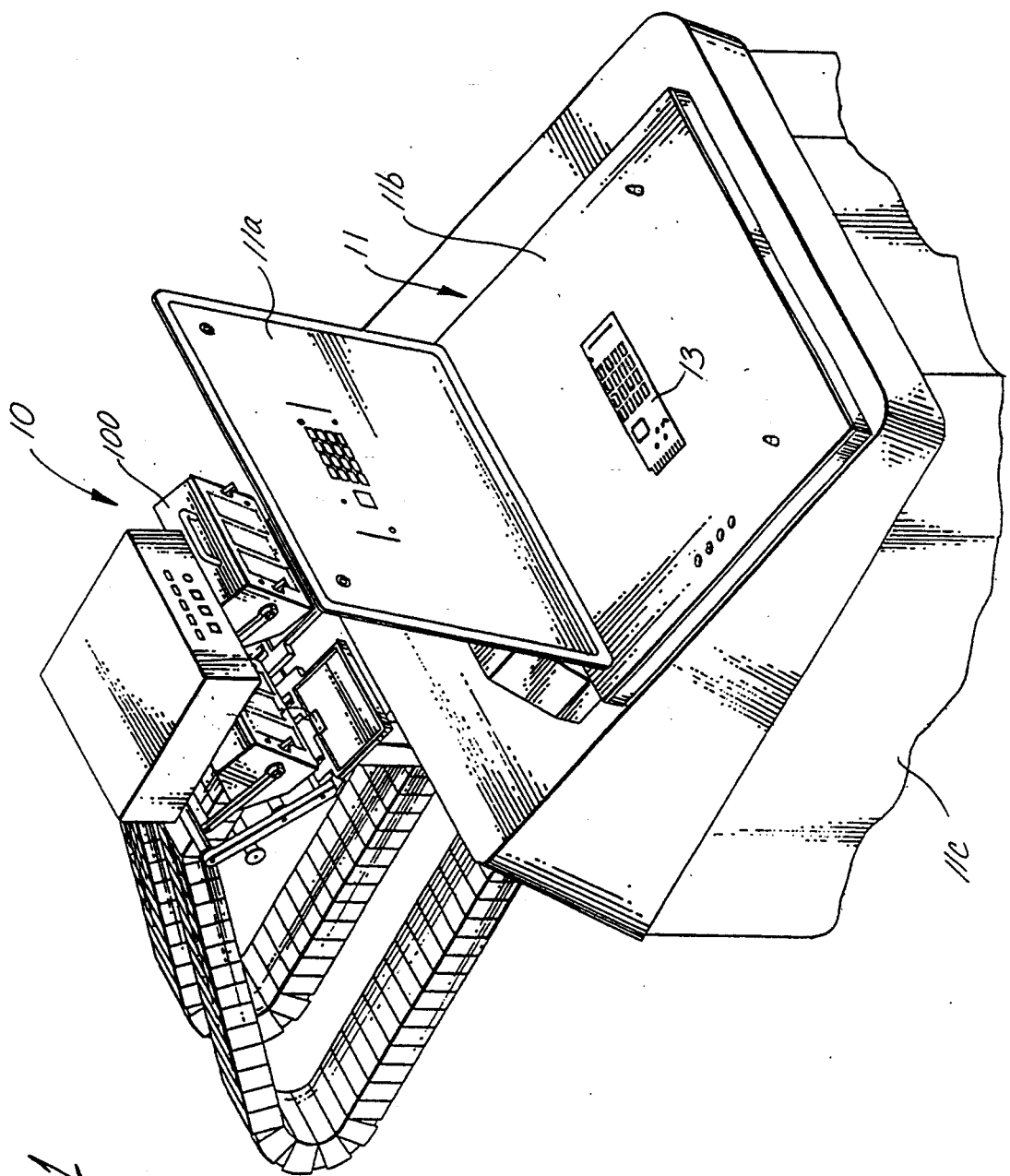
FIG. 1 is a fragmentary perspective view of a bare board circuit tester incorporating the use of a dual access wired type test fixture.

FIG. 1 illustrates a dual side access dedicated bare board circuit tester 10 disclosed in U.S. patent application Ser. No. 07/824,854, filed Jan. 22, 1992, now U.S. Pat. No. 5,270,641. This application is incorporated herein by reference. The referenced bare board circuit tester comprises a dual side access wired type test fixture 11 for testing the electrical continuity of both sides of a printed circuit board (PCB) 13. The wired test fixture is removably mounted to a receiver base of the tester. The wired test fixture 11 includes an upper probe plate 11a, a lower probe plate 11b, and interface pins hard-wired to test probes in the fixture. The interface pins are releasably connected to receiver interface pins on the receiver base when the wired fixture is mounted to the tester. Electronic test circuits are contained within a housing 11c below the receiver base.

The present invention, in the most general sense, comprises a test fixture that is compatible with the referenced bare board circuit tester and can be used interchangeably to replace the wired type test fixture 11 with a grid type test fixture in situations where using a grid type circuit board testing would be more convenient and/or economically attractive than using the wired type circuit board tester.

Converting a wired bare board circuit tester to a grid type tester by using such a compatible grid test fixture may be advantageous when testing PCB's having a variety of different sizes and/or configurations, particularly small lots of such boards. Using a wired type test fixture to test such a variety of differently configured PCB's requires time-consuming hard-wiring of the respective probes in each plate for each different board. Using a grid type test fixture would only require that a different translator be configured for each different board. By comparison, the time and labor associated with hard-wiring each of the upper and lower test probes would typically be greater than the labor associated with constructing a translator fixture. The invention provides the ability to use many of the same components of a dedicated bare board test system, such as the test electronics and associated interfaces, test pin alignment means, and actuator means, while the fixturing is selectively interchanged between a wired type test fixture and a grid type test fixture. The present invention comprises a grid interface test fixture module that is configured to facilitate interconnection with the referenced circuit board tester in a manner that preserves all of the operational features of the tester so that the use of the grid fixture is truly interchangeable with the existing wired fixture without in any way compromising the operational capability of the tester.

Figure 2:
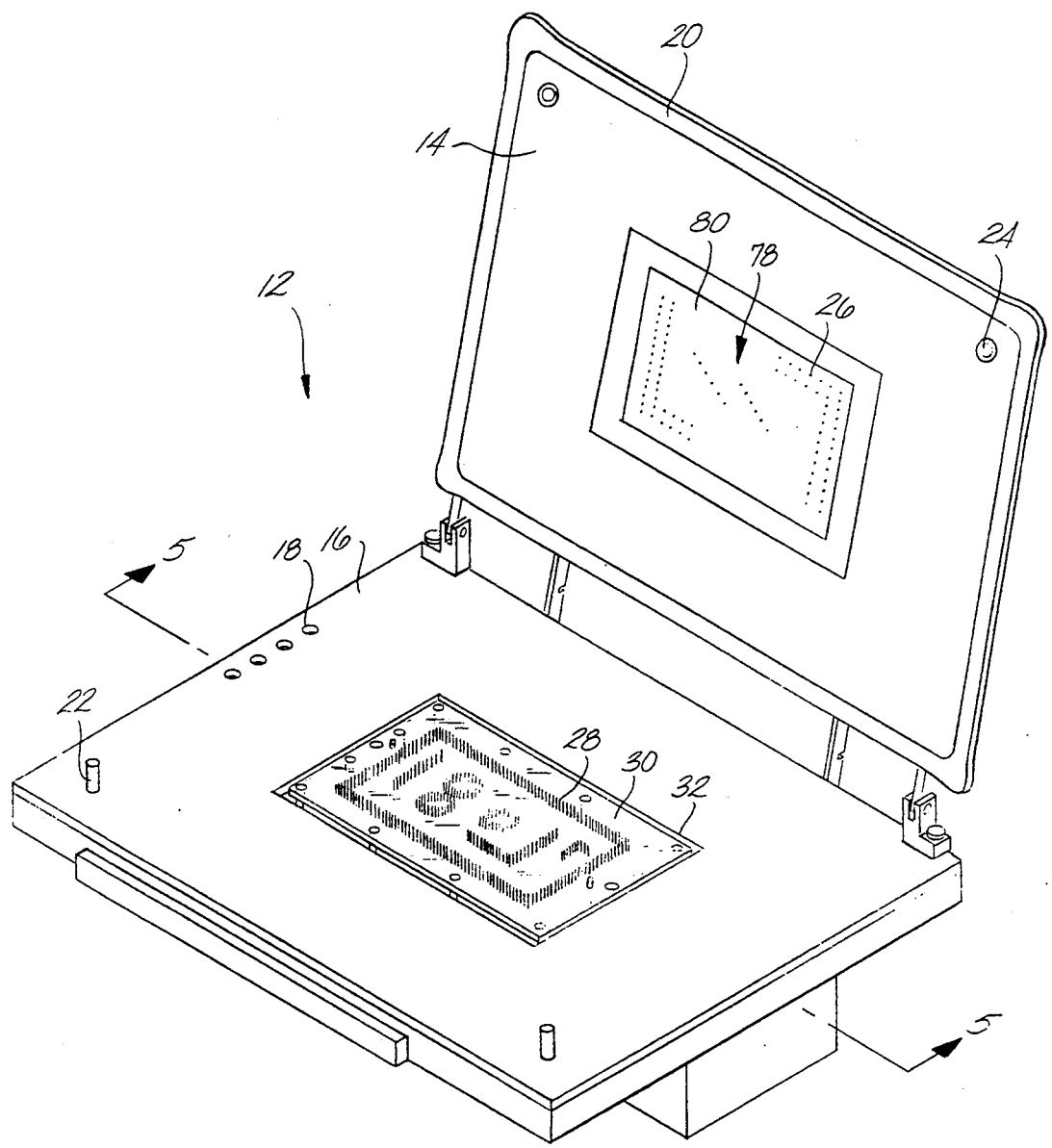
FIG. 2 is a perspective view of a grid interface test fixture module constructed according to principles of this invention, showing an upper probe plate of the test fixture in the open position.

FIG. 2 illustrates a preferred embodiment of a grid interface test fixture module 12 in the open position. The grid interface test fixture module 12 comprises an upper probe plate 14 hinged to a lower probe plate 16 in a manner permitting the upper plate to be lowered onto the lower plate. For purposes of reference, the surface of the lower probe plate that communicates with upper probe plate will be referred to as the front side surface. The surface of the upper probe plate that communicates with the lower probe plate will also be referred to as the front side surface. Additionally, the surface of the PCB that communicates with the front side surface of the lower probe plate will be referred to as the back side surface and the surface of the PCB that communicates with the front side surface of the upper probe plate will be referred to as the front side surface. The front side surface of the lower probe plate has a series of vacuum holes 18 that communicate with a vacuum cavity within the fixture.

The upper probe plate 14 has a bottom peripheral seal 20 for sealing to the front side surface of the lower probe plate to maintain a vacuum seal within the interior of the fixture when the upper probe plate is lowered onto the lower probe plate during testing. The lower probe plate has a pair of pins 22 that register with a pair of alignment holes in the upper probe plate 24 to guide the upper probe plate and align it with the lower probe plate when the grid interface test fixture is closed.

An array of upper test probes 26 are mounted in the front side surface of the upper probe plate 14 and are arranged in a configuration that corresponds with predetermined contact points of the circuit on the front side surface of the particular PCB under test. An array of lower test probes 28 are mounted in a translator fixture 30 that is movably positioned within a recessed opening 32 in the front side surface of the lower probe plate. The lower test probes 28 are arranged on the translator fixture in a configuration that corresponds with predetermined test points in circuits on the back side surface of the PCB under test.

The lower probe plate 16 comprises a generally planar front side surface having the recessed opening 32, referred to as the translator fixture opening, near its center. The opening is of sufficient size and shape to accommodate placement of the translator. In a preferred embodiment, the opening may be configured in the shape of a rectangle having dimensions of approximately eight inches by ten inches. The depth of the opening may be approximately five inches.

Figure 3:
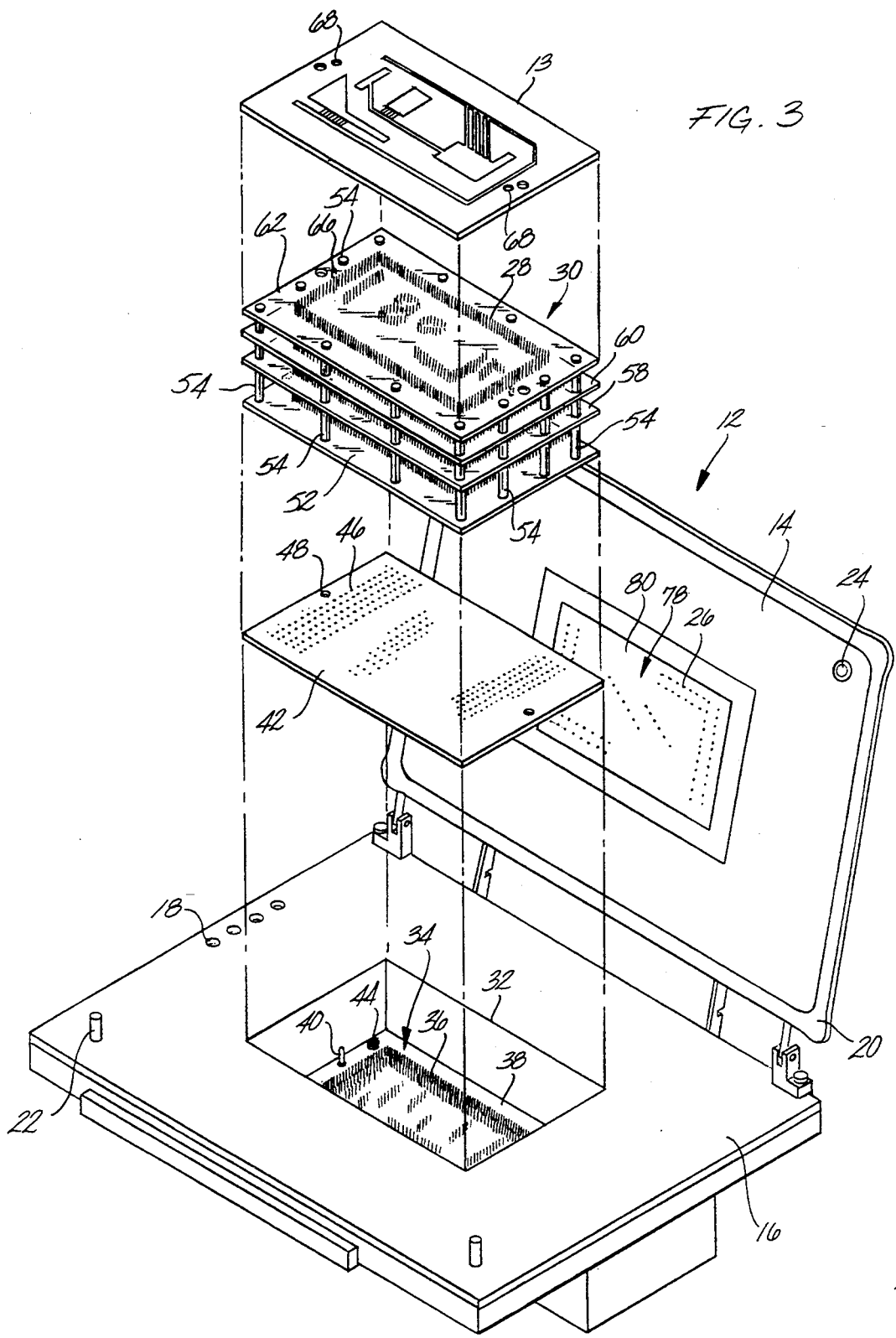
FIG. 3 is an exploded perspective view of the grid interface test fixture illustrating the principal components of a bottom probe plate.

As shown in FIG. 3, a lower pin grid 34 resides at the base of the translator fixture opening 32 and comprises a plurality of spring-loaded lower probe plate pins 36, arranged in a standard pin grid array, extending through a dielectric baseplate 38. The lower probe plate pins may be made from well known electrically conductive materials such as beryllium copper or the like. The lower probe plate pins 36 are uniformly distributed within the lower pin grid except for a portion extending around the periphery of the dielectric baseplate. The number of lower probe plate pins making up the lower pin grid may be dependent upon the size of the particular translator fixture opening and the number of test probe interconnections that the grid interface test fixture is capable of accommodating. In a rectangular preferred embodiment comprising a translator fixture opening of approximately eight inches by ten inches, the lower pin grid may comprise approximately 8,000 lower probe plate pins arranged in a standard pin grid array.

Stripper plate tooling pins 40 are mounted at opposing ends of the dielectric baseplate for facilitating alignment of a stripper plate 42 on the lower pin grid 34. A separate baseplate spring 44 at each corner of the dielectric baseplate provides a spring biasing force between the lower pin grid and the stripper plate. This spring-biased compliance produces a desired amount of contact between the upper and lower test probes and the respective surfaces of the PCB when the upper probe plate is lowered onto the lower probe plate for testing.

The stripper plate 42 comprises a sheet of dielectric material having plurality of pin openings 46 configured in a pattern corresponding to the standard pin grid array of the lower probe plate pins 36. The stripper plate has alignment holes 48 located at opposing edges of the plate to register with corresponding stripper plate tooling pins 40 on the baseplate. In a preferred embodiment, the stripper plate has a thickness of approximately three-eighths of an inch. The stripper plate is disposed on the surface of the lower pin grid 34 so that as the stripper plate tooling pins 40 register with the tooling pins holes 48, the pin openings 46 in the stripper plate 42 are aligned with and thereby accommodate the lower probe plate pins 36. The stripper plate should be of sufficient thickness so that each lower probe plate pin only partially fills a respective pin opening 46 when the stripper plate is placed on the lower pin grid without the stripper plate being compressed against the baseplate springs 44. In a preferred embodiment, the lower plate pins should only occupy approximately one-half of the length of the pin openings. It is desirable that the stripper plate be configured to accommodate only a portion of the length of each grid pin so that the stripper plate may simultaneously accommodate a plurality of the lower test probes 28 from the opposite surface.

Figure 4:
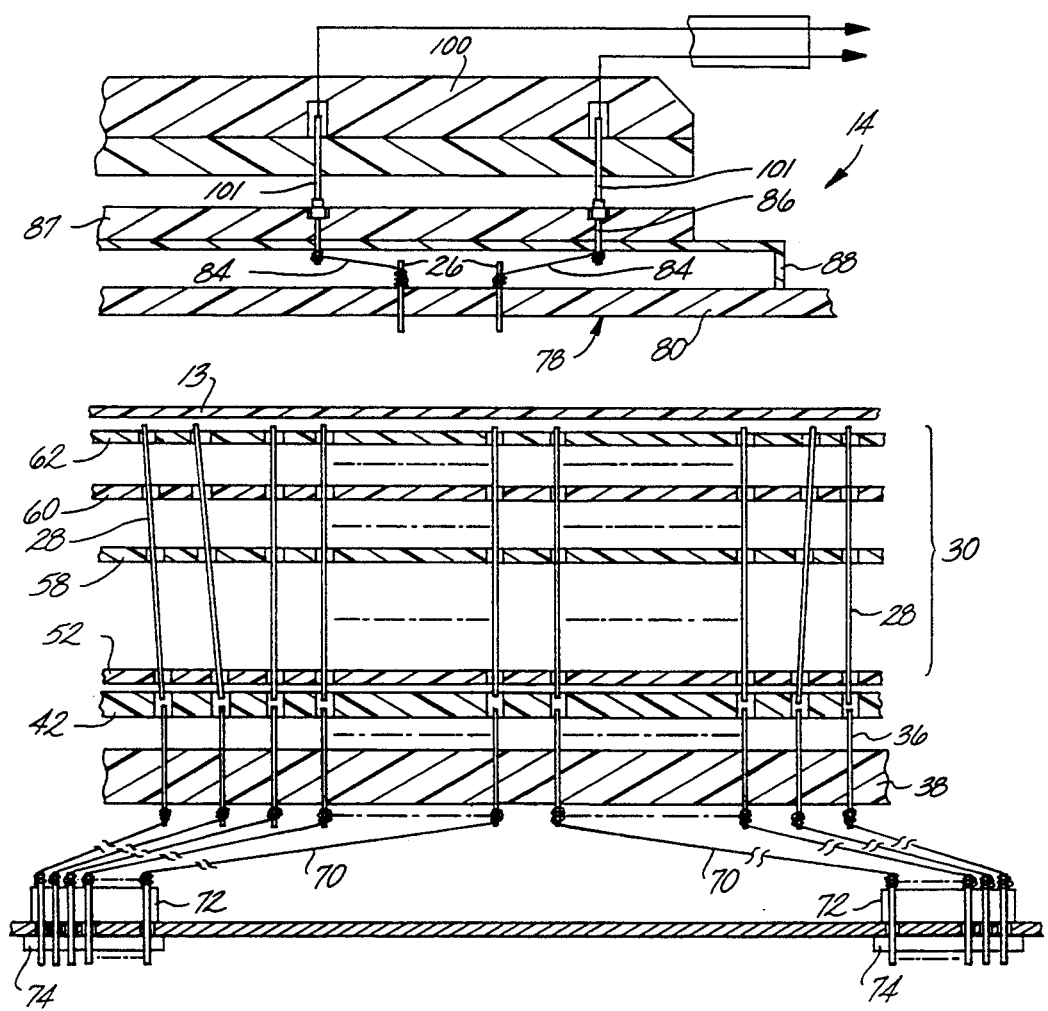
FIG. 4 is a fragmentary semi-schematic cross sectional view of the grid interface test fixture illustrating principal components of an upper probe plate and a lower probe plate during testing of a printed circuit board testing.

As shown in FIGS. 3 and 4, the translator fixture 30 comprises a series of interconnected vertically spaced apart, parallel dielectric plates. The plates contained in the translator fixture retain and reconfigure the plurality of lower test probes (or translator probes) 28. The lower test probes may also be referred to as tilt pins because of the manner in which the probes are tilted within the translator fixture, in order to interact with the standard array of lower probe plate pins at one end, and interact with the random arrangement of predetermined test points on the back side surface of the PCB at the other end. The translator fixture plate communicating with the stripper plate is referred to as the grid plate 52. The grid plate comprises a sheet of dielectric material having a plurality of lower test probe openings configured in a pattern corresponding to the lower probe plate pin openings in the stripper plate. The grid plate also includes a number of holes located around its periphery to support the bottoms of posts 54 used to connect together the series of plates making up the translator fixture.

The translator fixture plate immediately above the grid plate is referred to as a first translator plate 58. This translator plate comprises a thickness of dielectric material having a plurality of lower test probe openings arranged in a pattern that may be slightly different or shifted from that of the grid plate. The shifted pattern of openings reconfigures the lower test probes away from the standard pattern of the pin grid array toward the random (off-grid) pattern of the test points on the PCB under test. The openings in the first translator plate may be oriented so the lower test probes may extend through the plate freely and without binding at a nonperpendicular angle of penetration, i.e., at 85 degrees. The first translator plate also comprises a number of holes, in the same location as the holes in the grid plate, for accommodating the posts that support the translator fixture plates.

The translator module plate located above the first translator plate is referred to as a second translator plate 60. This translator plate comprises a sheet of dielectric material having a plurality of test probe openings arranged in a pattern slightly shifted from that of the pin grid and the adjacent first translator plate. The shifted pattern of pin openings continues to reconfigure the lower test probes from the grid pattern to the off-grid pattern. This translator plate also accommodates the posts 54 for interconnection with adjacent plates making up the translator fixture.

The translator fixture may comprise any number of translator plates. The particular number of translator plates used may vary depending on the particular arrangement and number of predetermined test points on the PCB. For purposes of illustration a translator module comprising only two translator plates is illustrated. However, in a preferred embodiment the translator module may comprise additional translator plates of the type previously described.

The support plate on the front side surface of the translator fixture that communicates with the back side surface of the PC board is referred to as an interface plate 62. The interface plate comprises a sheet of dielectric material having a plurality of lower test probe openings arranged in a pattern corresponding to the random off-grid arrangement of test points on the PCB.

The lower test probes 28, or the tilt pins, may be configured having two different diameters (not shown) in order to facilitate their retention within the translator fixture. For example, each lower test probe may be configured having a diameter at each end that is larger than the diameter of the remaining portion of the probe. In order to retain lower test probes configured in this manner within the translator fixture, the translator module may be configured having a grid plate and a interface plate with probe openings approximately similar in diameter to the pin ends, and having translator plates configured with probe openings approximately similar to the diameter of the remaining portions of the probes. Configured in this manner, the lower test probes are be retained within the translator module because the end portions of each probe would be unable to pass through the probe openings in the translator plates.

Alternatively, the lower test probes can be configured having a diameter at each end that is smaller than the diameter of the remaining portion of each pin. In this embodiment, the probes may be retained within the translator fixture by configuring the probe openings in the grid and interface plate to accommodate the diameter of the probe ends, and the pin openings in the translator plates to accommodate the diameter of the remaining portion of each probe. Configured in this manner, the lower test probes are retained within the translator fixture because the center portion of each probe would be unable to pass through the probe openings in either the grid plate or the interface plate.

As shown in FIGS. 3 and 4, the translator fixture 30 is movably disposed on the surface of the stripper plate 42 so that the lower test probes 28 retained within the translator fixture and protruding from the lower surface of the grid plate 52 register with and extend a predetermined distance into the pin openings 46 in the stripper plate 42. The lower test probes should be of sufficient length so that they do not protrude from the upper surface of the interface plate 62 of the translator fixture once the translator fixture has been positioned, without compressing the baseplate springs 44, onto the stripper plate. Once placed onto the stripper plate, the baseplate springs may cause the front side surface of the translator fixture to protrude from the plane of the front side surface of the lower probe plate a predetermined distance (not shown). In a preferred embodiment, the front side surface of the translator fixture may protrude approximately one-quarter of an inch. PCB tooling pins 66 located near opposing edges of the interface plate 62 register with fixturing holes 68 at respective edges of the PCB to align the PCB onto the surface of the translator fixture for testing.

Figure 5:
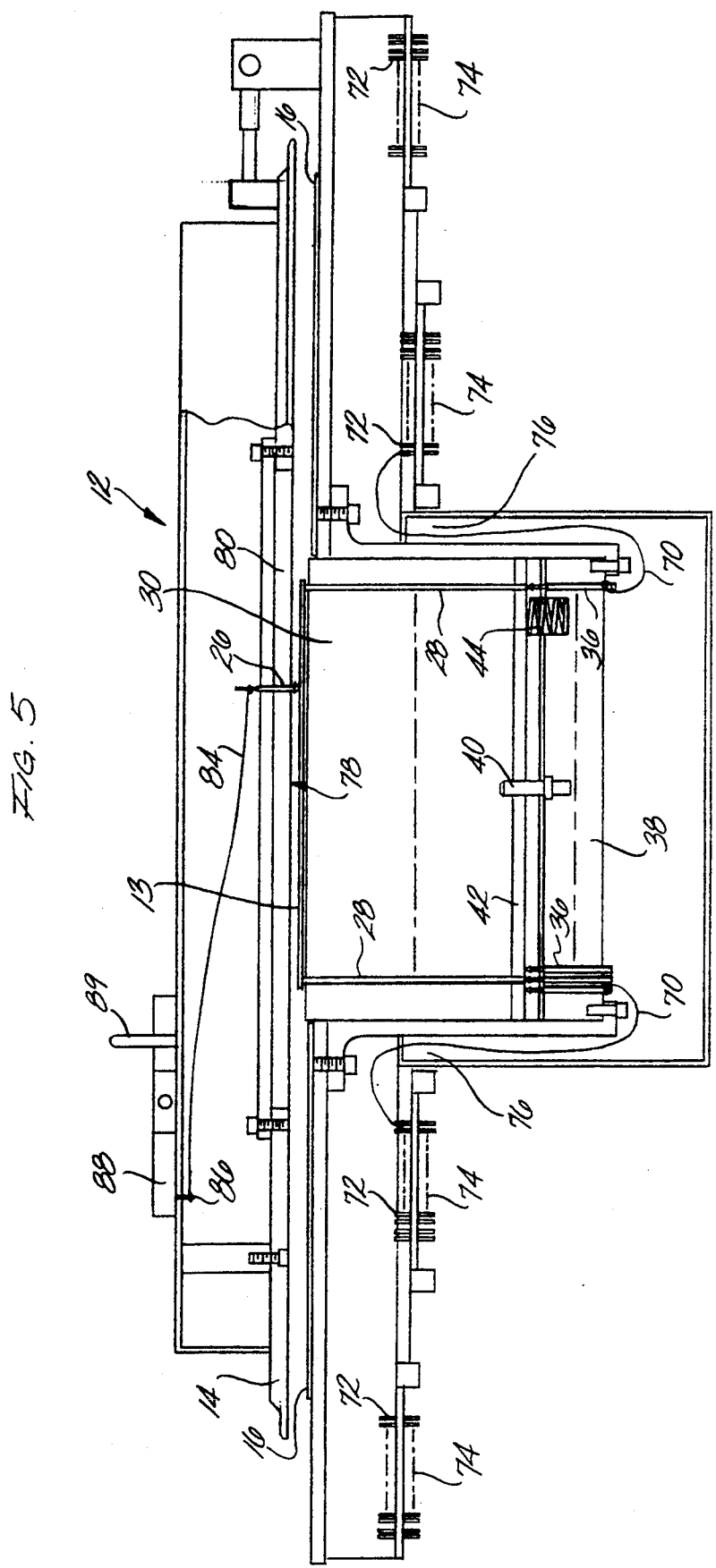
FIG. 5 is a cross-sectional view of the grid interface test fixture illustrating the electrical connections between probes in the upper and lower probe plates and respective interface pins.

As shown in FIGS. 4 and 5, the ends of the lower probe plate pins 36 opposite to the ends communicating with the lower test probes 28 extend into the interior of the lower probe plate housing. These ends of the lower probe plate pins are electrically connected, by lower probe plate interface wires 70, to the ends of lower probe plate interface pins 72. As shown in FIG. 5, the lower probe plate interface pins are located at opposing ends of the lower probe plate housing and are arranged in blocks 74 configured to align with corresponding receiver interface probes on the bare board circuit tester. The lower probe plate interface pins 72 extend through the back side surface of the lower probe plate, i.e., the surface opposite to the lower probe plate surface that communicates with the PCB, so that their opposite ends protrude from the back side surface the lower probe plate. The lower probe plate interface pins 72 are arranged on the back side surface in the lower probe plate interface blocks 74. The interface wires 70 are hard-wired from the ends of the lower probe plate pins 70 through an interface wire channel 76, located at opposing sides of the lower probe plate housing, to corresponding lower probe plate interface pins 72. The lower probe plate interface blocks are positioned on the back side surface of the lower probe plate to facilitate interconnection with the bare board circuit tester. The interface pins 74 preferably comprise solid interface pins or fixed pins adapted to make contact with corresponding spring loaded receiver interface probes on the bare board circuit tester.

In FIG. 5, for purposes of illustration and clarity, only two lower plate pins are shown connected to a lower probe plate interface pin. However, it is to be understood that all of the lower plate pins are electrically connected to respective lower probe plate interface pins in a similar manner.

As shown in FIGS. 4 and 5, the upper probe plate 14 comprises an upper pin grid 78 comprising a plurality of the spring-loaded upper test probes 26 extending through an upper pin grid plate 80. The upper pin grid is located near the center of the upper probe plate and may have a size and shape that facilitates communication with the front side surface of the PCB, placed onto the translator fixture, when the upper probe plate is lowered into test position. The upper test probes may be arranged in a random pattern corresponding to the predetermined contact test point locations in circuits on the front side of the PCB. The upper pin grid may be constructed by drilling the desired configuration of upper test probe openings into the upper pin grid plate 80 and inserting the spring-loaded upper test probes 26.

Alternatively, the upper pin grid may incorporate the use of an upper probe plate translator fixture (not shown), similar to the translator module previously described for the lower probe plate, in order to reconfigure a standard pin grid array from a standard grid array of an upper pin grid to the random arrangement of contact points at the front side surface of the PCB.

As shown in FIGS. 4 and 5, the ends of the upper test probes 26, opposite to the ends protruding through the upper pin grid 78, extend into the inside body of the upper probe plate and are electrically connected by upper probe plate interface wires 84 to corresponding upper probe plate interface pins 86. These pins are solid metal pins located in a uniform grid pattern on a plate 87 mounted to a housing 88. The upper interface pins are arranged in configuration and number to correspond to interface pins on the bare board circuit tester. The upper interface pins protrude from the back side surface of the upper plate 87 to facilitate interconnection with the bare board circuit tester in the manner described in the '854 application (now U.S. Pat. No. 5,276,041) which is incorporated by reference.

In FIG. 5, for purposes of illustration and clarity, only one upper test probe 26 is shown connected to an upper probe plate interface pin 86. However, it is to be understood that all of the upper test probes are electrically connected to respective upper probe plate interface pins in a similar manner.

The continuity of a PCB may be tested by placing its back side surface on the surface of the interface plate of the translator fixture disposed within the lower probe plate. The upper probe plate is then lowered into its down position adjacent to the lower probe plate and a vacuum is applied between the upper and lower probe plates. As shown in FIG. 4, once the upper probe plate has been lowered to its testing position the PCB is interposed between the upper test probes in the upper probe plate and the lower test probes in the translator fixture disposed in the lower probe plate.

The vacuum exerted between the upper and lower probe plates causes the spring-loaded test probes in the upper probe plate to impose a downward force onto the front side surface of the PCB, forcing the translator module against the stripper plate 42 and compressing the dielectric baseplate springs 44. As the baseplate springs are compressed and the stripper plate is forced down onto the lower probe pin grid 34, the spring-loaded lower plate pins 36 are forced through the pin openings 46 in the stripper plate. As the lower probe plate pins travel through the pin openings they connect with and exert a force on the ends of the lower test probes 28 protruding from the translator module 30, forcing the opposite ends of the lower test probes into contact against the back side surface of the PC board. Accordingly, the spring force exerted by the lower probe plate pins 36 and the upper test probes is sufficient to provide the desired degree of pressure contact against the respective surfaces of the PC board to ensure an accurate measurement of electrical continuity.

Figure 6:
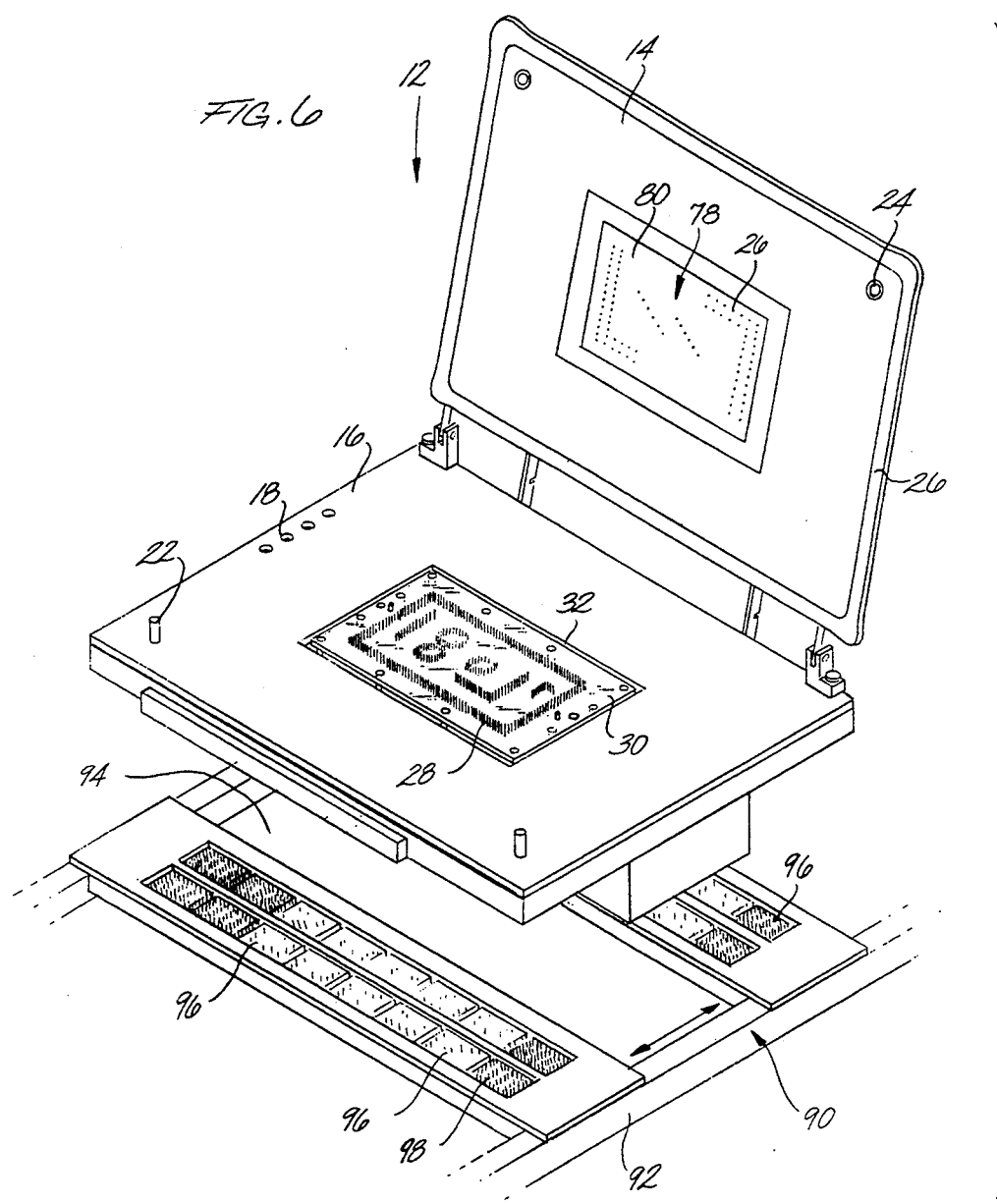
FIG. 6 is an exploded perspective view illustrating the connection between the grid interface test fixture and a test head receiver of the bare board circuit tester.

The grid interface test fixture module 12 is configured so that it may be conveniently mounted to and electrically interconnected with a bare board circuit tester configured to accommodate interconnection with either a wired type test fixture or the grid interface test fixture. As shown in FIG. 6, the referenced bare board circuit tester comprises a test head receiver 90 for accommodating interconnection with a wired type test fixture. The test head receiver comprises a receiver frame 92 having a receiver opening 94 located at the center of the receiver frame. A number of receiver interface blocks 96 are located at opposing ends of the receiver frame. The receiver frame may be adjustable so that the size of the receiver opening, and thus the distance between opposing pairs of receiver interface blocks, may be configured to accommodate a grid interface test fixture having a size and/or shape different from that described and illustrated.

Each receiver interface block 96 comprises a number of electrically conductive spring-biased receiver interface probes 98 arranged in configuration and number to provide electrical interconnects with the ends of the lower probe plate interface pins 72 in the lower probe plate interface blocks 74 located in the lower probe plate 16, as shown in FIG. 5. The grid interface test fixture module is interconnected with the test head receiver by first removing the wired test fixture 11 from the receiver base of the tester and replacing it with the grid fixture module of this invention. The grid interface test fixture is lowered onto the surface of the test head receiver so that the extended portion of the back side surface of the lower probe plate, corresponding to the translator module opening 32 in the front side surface of the lower probe plate, passes through the receiver opening 94. The grid interface fixture is lowered down onto the test head receiver until the lower interface pins 72 in each lower interface block 74 communicate and make electrical connection with respective spring loaded receiver interface probes 98 in the receiver interface blocks 96. Once the grid interface test fixture is mounted onto the test head receiver of the bare board circuit tester, electrical signals may be communicated from the grid interface test fixture, through the receiver interface probes, and to the external electronic test analyzer.

Figure 7:
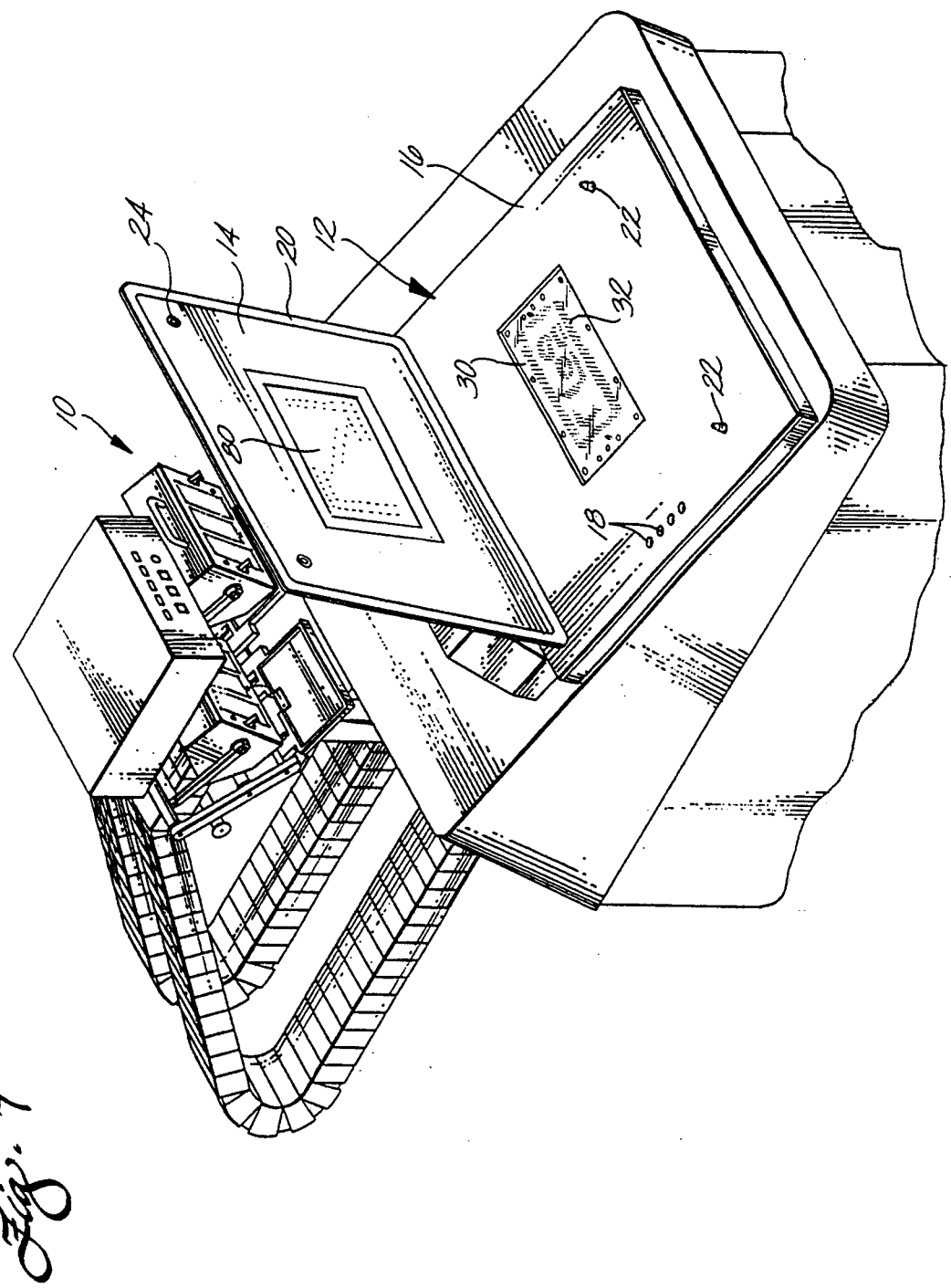
FIG. 7 is a fragmentary perspective view of the bare board circuit tester using the grid interface test fixture module and showing the tester in an open position.

The grid interface test fixture module as connected to the test head receiver, and as mounted on the referenced bare board circuit tester with the upper probe plate in the open position, is illustrated in FIG. 7. FIG. 7 illustrates the grid interface test fixture according to principles of this invention being interchangeable with the wired type test fixture illustrated in FIG. 1.

The upper probe plate of the grid interface test fixture may be connected to an upper interface connector 100 of the existing bare board circuit tester 10. As shown in FIG. 8, the bare board circuit tester comprises at least one upper interface connector having a number of spring loaded upper interface pins 101 (see FIG. 4) arranged in number and configuration to electrically interconnect with the upper probe plate interface pins 86 extending from the upper probe plate interface blocks 87 on the back side surface of the upper probe plate. The upper probe plate is connected to the upper interface connector by lowering the upper interface connector onto a respective upper probe plate interface block so that the guide pins 89 extending from the block register with alignment holes (not shown) in the upper interface connector. The upper interface connector is lowered onto the lower probe plate interface block until the interface pins in the upper connector interconnect with respective interface pins in the lower probe plate interface block. The upper interface connector may be locked into place by rotating a lever 112 clockwise causing a pair of hooks (not shown) attached to the lever to engage and forcibly interact with a pair of pins (not shown) attached to the lower probe interface blocks.

The grid interface test fixture configured according to principles of this invention may be referred to as a "dual access" test fixture because electrical interface between the circuit tester and the upper and lower probe plates may be achieved independently via respective upper and lower probe plate interface pins.

Once a printed circuit board is placed onto the surface of the translator module and the upper and lower probe interface blocks are connected to bare board circuit tester, the grid interface test fixture is placed into its testing position by lowering the upper probe place down adjacent with the lower probe plate, as shown in FIG. 8. A vacuum may be applied to achieve the desired degree of contact between the upper and lower test probes and the respective surfaces of the PC board. The grid interface test fixture configured as specifically described and illustrated facilitates the simultaneous continuity testing of both sides of a PCB using the referenced bare board circuit tester. Electrical signals applied to circuits at the back side surface of the PCB travel from the lower test probes, through the connecting lower plate pins, through the lower probe plate interface wires, through the lower probe plate interface pins, through the receiver interface pins in the bare board circuit tester and into the external electronic test analyzer. Electrical signals applied to circuits at the front side of the PC board travel from the upper test probes, through the upper probe plate interface wires, through the upper probe plate interface pins, through the upper interface pins in the bare board circuit tester and into the external electronic test analyzer.

Alternatively, the grid interface test fixture according to the present invention may be configured to test only one surface of a PC board if desired, i.e., the upper probe plate may be configured without upper test probes protruding from the front side surface. The grid interface test fixture may used to test the continuity of both sides of a single PCB having a size approximately equal to the size of the translator module. Alternatively, the grid interface test fixture may be used to test both sides of multiple PCB's providing that the PC boards are sized small enough that they can all fit onto the surface of the translator module.

The grid interface test fixture is configured to promote convenient conversion from wired type testing, in the referenced bare board circuit tester, to grid type testing by simply removing the existing wired type fixture module and interchanging it with the grid interface test fixture module. Accordingly, the grid interface test fixture module provides owners of bare board circuit testers, originally configured to accommodate only wired type test fixtures, the flexibility of choosing among the most time efficient and cost efficient method of testing a particular board without having to incur the substantial capital investment associated with purchasing a dedicated grid type tester.

The referenced bare board circuit tester may be converted from a wired type tester to a grid type tester by the following steps: (1) disconnecting the electrical connection between the upper probe plate of the wired test fixture and an upper interface connector of the circuit board tester; (2) disconnecting the electrical connection between the lower probe plate of the wired test fixture and a test head receiver of the circuit board tester; (3) removing the wired type test fixture from the circuit board tester; (4) installing the grid interface test fixture onto the portion of the circuit board tester previously occupied by the wired type test fixture; (5) electrically connecting the upper probe plate of the grid interface test fixture to the upper interface connector of the circuit board tester; and (6) electrically connecting the lower probe plate to the test head receiver of the circuit board tester.

Although a preferred embodiment of the grid interface test fixture has been specifically described and illustrated, it is to be understood that variations or alternative embodiments of the grid interface test fixture apparent to those skilled in the art are within the scope of this invention. For example, the grid interface test fixture may be configured to accommodate interconnection with a bare board circuit tester that is configured other than that specifically described or illustrated, i.e., one that can not accommodate a dual access test fixture.

Specifically, the grid interface test fixture may be configured to accommodate interconnection with bare board circuit testers that do not have an upper interface connection and instead transfer electrical signals from the upper probe plate to the external electronic test analyzer through electrical connections made in the lower probe plate. This arrangement is illustrated schematically in FIG. 9. In order to accommodate interconnection with this type of bare board circuit tester the lower pin grid may be configured having a number of lower plate transfer pins 36' arranged about the periphery of the lower plate pins. The transfer pins may extend to the front side surface of the lower probe plate though translator transfer pins 28' arranged at the periphery of within the translator fixture. However, unlike the lower test probes, the translator transfer pins 28' are arranged in a configuration corresponding to the transfer pins in the lower pin grid without being reconfigured. In the upper probe plate, instead of wiring the upper test probes to interface pins, the upper test probes may be wired to a number of upper plate transfer pins 86' protruding from the front side surface of the upper probe plate and arranged around the periphery of the upper test probes 26. The upper transfer pins 86' are preferably solid interface pins of "SIPS" which include flat ends for accessing the ends of the transfer pins 28' at the periphery of the translator fixture.

The transfer pins in both the upper and lower probe plates are arranged in a configuration to extend around the periphery of the upper and lower test probes and interconnect with each other when the upper probe plate is lowered into the testing position against the lower probe plate. The ends of the lower plate transfer pins extending into the interior of the lower probe plate housing are electrically connected by transfer wires to lower probe plate interface pins so that the electrical signals to and from the upper probe plate may be transferred through the lower probe plate interface pins, through the test head receiver and to an external electronic test analyzer. Compliancy is provided by the spring probes contained in the receiver base.

Configuring the grid interface test fixture to accommodate such single access bare board circuit testers will effectively reduce the number of upper and lower plate test probes that can be used for continuity testing by the number of transfer pins that are needed to transfer the electrical signal to the upper probe plate. In such an alternative embodiment the number of lower plate test probes may be reduced from approximately 8,000 to 6,000 to accommodate 2,000 transfer pins needed to transfer the electrical signals from approximately 2,000 upper probe plate test probes.

Since many such variations may be made, it is to be understood that within the scope of the following claims, this invention may be practiced otherwise than specifically described.

What is claimed is:

1. A modular dual side access circuit board tester adapted for conversion between a wired type tester and a grid type tester, either of which is connected to test circuits in a common electronic test analyzer for testing the electrical continuity of the printed circuit board, the circuit board tester including:
    a receiver base having receiver interface probes connected to the test circuits in the electronic test analyzer;
    a housing removably mounted in an opening in the receiver base;
    a lower probe plate on the housing having an array of lower probe plate interface pins for releasable connection to the receiver interface probes when the housing is removably mounted in the opening of the receiver base;
    an upper probe plate mounted on the housing and having a plurality of upper test probes for connection with predetermined test points in circuits on a front side of the printed circuit board;
    means for electrically connecting test signals from the upper test probes to the test circuits in the electronic test analyzer;
    the lower probe plate mounted on the housing below the upper probe plate and having a recessed opening facing toward the upper probe plate with a grid array of grid pins in a base of the recessed opening;
    a translator fixture removably disposed within the recessed opening of the lower probe plate, the translator fixture comprising upper and lower probe support plates arranged to removably support a plurality of lower test probes which are reconfigurable in the probe support plates for defining a selected probe pattern on an upper side and a grid pattern on a lower side of the translator fixture, the translator fixture disposed within the recessed opening for releasably connecting the selected probe pattern of lower test probes to a predetermined pattern of test points in circuits on a back side of the printed circuit board and for releasably connecting the grid pattern of lower test probes to the grid array of grid pins in the recessed opening of the lower probe plate, the translator fixture thereby providing means for translating test signals through the lower test probes from the grid array of grid pins in said recessed opening to the predetermined pattern of test points on the back side of the printed circuit board; and
    means within the housing for electrically connecting test signals from the grid pins to the lower probe plate interface pins for communication with the test circuits in the electronic test analyzer.

2. Apparatus according to claim 1 wherein the upper test probes are electrically connected to corresponding interface pins arranged on the upper probe plate for providing electrical interconnection of test signals between the upper test probes and the electronic test analyzer.

3. Apparatus according to claim 1 wherein the grid pins comprise spring probes, and wherein the lower probe plate contains a dielectric stripper plate removably disposed below the translator fixture and over the array of grid pins in the recessed portion of the lower probe plate, the stripper plate having a hole pattern for receiving portions of the grid pins for spring biased alignment with the lower test probes on the translator fixture.

4. Apparatus according to claim 1 in which the upper probe plate includes upper interface pins hard-wired internally within the upper probe plate to the upper test probes, the upper interface pins being electrically connected to the test circuits in the electronic test analyzer.

5. A modular dual side access circuit board tester adapted for conversion between a wired type tester and a grid type tester, either of which is connected to test circuits in a common electronic test analyzer for testing the electrical continuity of the printed circuit board, the circuit board tester including:

a receiver base having receiver interface probes connected to the test circuits in the electronic test analyzer;

a housing removably mounted in an opening in the receiver base;

a lower probe plate on the housing having an array of lower probe plate interface pins for releasable connection to the receiver interface probes when the housing in removably mounted in the opening of the receiver base;

an upper probe plate mounted on the housing and having a plurality of upper test probes for connection with predetermined test points in circuits on a front side of the printed circuit board;

means for electrically connecting test signals from the upper test probes to the test circuits in the electronic test analyzer;

the lower probe plate mounted on the housing below the upper probe plate and having a recessed opening facing toward the upper probe plate with a grid array of grid pins in a base of the recessed opening, the upper probe plate having an open position to provide access to the recessed opening and a closed position that covers the recessed opening;

a translator fixture removably disposed within the recessed opening of the lower probe plate, the translator fixture comprising upper and lower probe support plates arranged to removably support a plurality of lower test probes which are reconfigurable in the probe support plates for defining a selected probe pattern on an upper side and a grid pattern on a lower side of the translator fixture, the printed circuit board being positionable on the upper side of the translator fixture when the upper probe plate is in the open position, the translator fixture disposed within the recessed opening for releasably connecting the selected probe pattern of lower test probes to a predetermined pattern of test points in circuits on a back side of the printed circuit board and for releasably connecting the grid pattern of lower test probes to the grid array of grid pins in the recessed opening of the lower probe plate, the upper probe plate movable to the closed position for connecting the upper test probes to the circuits on the front side of the board, the translator fixture providing means for translating test signals through the lower test probes from the grid array of grid pins in said recessed opening to the predetermined pattern of test points on the back side of the printed circuit board; and means within the housing for electrically connecting test signals from the grid pins to the lower probe plate interface pins for communication with the test circuits in the electronic test analyzer, the test signals from the upper test probes communicated to the electronic test analyzer independently of the test probes in the translator fixture.

6. Apparatus according to claim 5 wherein the upper test probes are electrically connected to corresponding interface pins arranged on the upper probe plate for providing electrical interconnection of test signals between the upper test probes and the electronic test analyzer.

7. Apparatus according to claim 5 wherein the grid pins comprise spring probes, and wherein the lower probe plate contains a dielectric stripper plate removably disposed below the translator fixture and over the array of grid pins in the recessed portion of the lower probe plate, the stripper plate having a hole pattern for receiving portions of the grid pins for spring biased alignment with the lower test probes on the translator fixture.

8. Apparatus according to claim 5 in which the upper probe plate includes upper interface pins hard-wired internally within the upper probe plate to the upper test probes, the upper probe plate interface pins being electrically connected to the test circuits in the electronic test analyzer.

9. A modular circuit board tester for converting from a wired type tester to a grid type tester for performing dual access electrical testing of both sides of a printed circuit board in which either tester is electrically connected to test circuits in a common electronic test analyzer for performing high speed testing of circuits on the circuit board, the circuit board tester comprising:

a receiver base having receiver interface probes connected to the test circuits in the electronic test analyzer;

a housing removably mounted in an opening in the receiver base;

a lower probe plate on the housing having an array of lower probe plate interface pins for releasable connection to the receiver interface probes when the housing in removably mounted in the opening of the receiver base;

an upper probe plate mounted on the housing and having a plurality of electrically conductive upper test probes arranged in a pattern corresponding to a predetermined pattern of test points on a front side of the printed circuit board;

the lower probe plate mounted on the housing below the upper probe plate, the housing having a recessed portion facing toward the upper probe plate, and a grid array of lower grid pins arranged within the recessed portion of the housing;

a translator fixture removably disposed within the recessed portion of the housing, the translator fixture comprising upper and lower probe support plates arranged to removably support a plurality of lower test probes which are reconfigurable in the probe support plates for defining a selected probe pattern on an upper side and a grid pattern on a lower side of the translator fixture, the translator fixture disposed within the recessed opening for releasably connecting the selected probe pattern of lower test probes to a predetermined pattern of test points in circuits on a back side of the printed circuit board and for releasably connecting the grid pattern of lower test probes to the grid array of grid pins in the recessed portion of the housing, the translator fixture thereby providing means for translating test signals through the lower test probes from the grid array of grid pins in said recessed portion to the predetermined pattern of test points on the back side of the printed circuit board;

a plurality of upper probe plate interface pins electrically connected to the upper test probes and disposed on the upper probe plate for facilitating interconnection with a releasable test head for communicating test signals from the upper test probes to the test circuits in the electronic test analyzer independently of the lower test probes; and means within the housing for electrically connecting test signals from the grid pins to the lower probe plate interface pins for facilitating interconnection with the test circuits in the electronic test analyzer.

10. Apparatus according to claim 9 wherein the upper test probes are electrically connected to corresponding interface pins arranged on the upper probe plate for providing electrical interconnection of test signals between the upper test probes and the electronic test analyzer.

11. Apparatus according to claim 9 wherein the lower grid pins comprise spring probes, and wherein the lower probe plate contains a dielectric stripper plate removably disposed below the translator fixture and over the array of lower grid pins in the recessed portion of the lower probe plate, the stripper plate having a hole pattern for receiving portions of the lower grid pins for spring biased alignment with the lower test probes on the translator fixture.

12. Apparatus according to claim 9 in which the upper probe plate includes upper interface pins hardwired internally within the upper probe plate to the upper test probes, the upper interface pins being electrically connected to the test circuits in the electronic test analyzer.

13. A modular circuit board tester for simultaneously testing the electrical continuity of circuits disposed on both sides of a printed circuit board, the circuit board tester being capable of interchangeably accommodating a wired test fixture and a grid test fixture for connection to test circuits in an electronic test analyzer, the circuit board tester comprising:

a receiver base having receiver interface probes connected to the test circuits in the electronic test analyzer;

a housing removably mounted in an opening in the receiver base;

a lower probe plate on the housing having an array of lower probe plate interface pins for releasable connection to the receiver interface probes when the housing in removably mounted in the opening of the receiver base;

an upper probe plate mounted on the housing and having a plurality of upper test probes for communicating with a front side of the printed circuit board;

the lower probe plate mounted on the housing below the upper probe plate and comprising a recessed portion having at its base a grid array of lower grid pins facing toward the upper probe plate the upper probe plate having an open position for accessing the recessed portion of the lower probe plate and a closed position for closing over said recessed portion during testing;

a translator fixture movably disposed within the recessed portion of the lower probe plate, the translator fixture comprising upper and lower probe support plates arranged to removably support a plurality of lower test probes which are reconfigurable in the probe support plates for defining a selected probe pattern on an upper side and a grid pattern on a lower side of the translator fixture, the translator fixture disposed within the recessed portion of the lower probe plate for releasably connecting the selected probe pattern of lower test probes to a predetermined pattern of test points in circuits on a back side of the printed circuit board and for releasably connecting the grid pattern of lower test probes to the grid array of grid pins in the recessed portion of the lower probe plate for translating test signals from the grid pins to the test points on the back side of the circuit board;

the upper probe plate moving to the closed position for contact between the upper test probes and the front side of the circuit board;

means for electrically connecting the upper test probes to the test circuits in the electronic test analyzer; and means within the housing for electrically connecting test signals from the lower grid pins to the lower probe plate interface pins.

14. A method for converting a circuit board tester from a dual side access wired type tester to a dual side access grid type tester for testing the electrical continuity of both sides of a printed circuit board, the method comprising the steps of:

providing a circuit board tester having an electronic test analyzer with test circuits for testing a printed circuit board mounted in the circuit board tester;

providing a wired type test fixture in the circuit board tester, the wired type test fixture having an upper probe plate connected to an upper interface connector of the circuit board tester for communicating test signals from an upper side of the printed circuit board to the test circuits in the electronic test analyzer, the circuit board tester further containing a receiver base having receiver interface probes connected to the test circuits in the electronic test analyzer, and an opening in the receiver base for removably receiving the wired type test fixture for connection to the receiver interface probes for thereby communicating with the test circuits in the electronic test analyzer;

disconnecting the upper probe plate of the wired type test fixture from the circuit board tester;

disconnecting the lower probe plate of the wired type test fixture from the receiver interface probes of the circuit board tester;

providing a grid type test fixture having a housing, a lower probe plate on the housing having an array of lower probe plate interface pins, an upper probe plate mounted on the housing and having a plurality of upper test probes, the lower probe plate having a recessed opening facing toward the upper probe plate and containing a grid array of grid pins in a base of the recessed opening:

installing the grid type test fixture in the opening of the receiver base previously occupied by the wired type test fixture;

electrically connecting the upper probe plate of the grid type test fixture to the upper interface connector of the circuit board tester;

providing a translator fixture comprising upper and lower support plates arranged to removably support a plurality of lower test probes which are reconfigurable in the probe support plates for defining a selected probe pattern on an upper side and a grid pattern on a lower side of the translator fixture;

electrically connecting the lower probe plate interface pins of the lower probe plate of the grid type test fixture to the receiver interface probes of the circuit board tester;

mounting the translator fixture in the recessed opening and releasably connecting the selected probe pattern of lower test probes to a predetermined pattern of test points in the circuits on the back side of the circuit board and for releasably connecting the grid pattern of lower test probes to the grid array of grid pins in the recessed portion of the housing, the translator fixture thereby providing means for translating test signals through the lower test probes from the grid array of grid pins in the recessed opening of the lower probe plate to the pattern of test points on the back side of the printed circuit board; and releasably connecting the upper test probes of the upper probe plate to the top side of the circuit board for communicating test signals to the electronic test analyzer.

15. Apparatus according to claim 1 in which the lower test probes comprise separate test pins mounted in hole patterns in the upper and lower support plates to translate between an off-grid pattern and an on-grid pattern.

16. Apparatus according to claim 5 including a peripheral seal on the upper probe plate for maintaining a vacuum seal in its closed position for producing pressure contact of the test probes with the front and back sides of the board.

17. Apparatus according to claim 16 in which the lower test probes comprise separate test pins mounted in hole patterns in the upper and lower support plates to translate between an off-grid pattern and an on-grid pattern.

* * * * *

UNITED STATES PATENT AND TRADEMARK OFFICE
CERTIFICATE OF CORRECTION

PATENT NO. : 5,450,017
DATED : September 12, 1995
INVENTOR(S) : Mark A. Swart

It is certified that error appears in the above-indentified patent and that said Letters Patent is hereby corrected as shown below:

```
Column 4, line 17, before "conjunction" insert -- in --.
Column 5, line 64, before "upper" insert -- the --.
Column 6, line 46, after "beryllium" insert a comma.
Column 6, line 54, delete "rectangular."
Column 6, line 55, before "translator" insert
        -- rectangular --.
Column 7, line 4, before "plurality" insert -- a --.
Column 7, line 14, change "pins" to -- pin --.
Column 8, line 33, change "a" (second occurence)
        to -- an --.
Column 8, line 38, after "probes are" insert -- to --.
Column 9, line 24, after "surface" insert -- of --.
Column 12, line 2, change "place" to -- plate --.
Column 12, line 28, after "fixture may" insert -- be --.
Column 15, line 15, after "housing" change "in"
        to -- is --.
Column 16, line 33, after "housing" change "in"
        to -- is --
Column 17, line 44, after "housing" change "in"
        to -- is --.
```

Signed and Sealed this

Ninth Day of April, 1996

*Attest:*

BRUCE LEHMAN

*Attesting Officer*    Commissioner of Patents and Trademarks